United States Patent
Maeda et al.

(10) Patent No.: US 6,236,122 B1
(45) Date of Patent: May 22, 2001

(54) LOAD DRIVE DEVICE

(75) Inventors: Kenichiro Maeda, Kanagawa; Daisuke Yoshida, Hatano; Koichi Kato, Hiratsuka; Yasushi Kawaji, Yokohama, all of (JP)

(73) Assignee: Komatsu Ltd. (JP)

( * ) Notice: Subject to any disclaimer, the term of this patent is extended or adjusted under 35 U.S.C. 154(b) by 0 days.

(21) Appl. No.: 09/292,223

(22) Filed: Apr. 15, 1999

Related U.S. Application Data

(62) Division of application No. 08/732,292, filed on Oct. 30, 1996, now Pat. No. 5,952,740.

(30) Foreign Application Priority Data

May 12, 1994 (JP) ...................................................... 6-98659

(51) Int. Cl.$^7$ .................................................. H01H 35/00
(52) U.S. Cl. ........................................... 307/125; 307/130
(58) Field of Search .................................... 307/125, 126, 307/130, 131, 139; 323/265, 266, 271, 282, 285; 361/152, 154, 170, 187; 327/538, 540, 541, 544, 375

(56) References Cited

U.S. PATENT DOCUMENTS

| | | | |
|---|---|---|---|
| 4,410,810 | * 10/1983 | Christen | ................................ 307/300 |
| 4,473,784 | 9/1984 | Morez . | |
| 4,873,453 | 10/1989 | Schmerda et al. . | |
| 4,967,309 | * 10/1990 | Hoffman | ................................ 361/160 |
| 5,216,353 | * 6/1993 | Mori | ....................................... 323/266 |
| 5,523,632 | 6/1996 | Seragnoli . | |
| 5,539,610 | 7/1996 | Williams et al. . | |
| 5,757,605 | * 5/1998 | Furukawa | ............................ 361/154 |
| 5,815,362 | * 9/1998 | Kahr et al. | ........................... 361/153 |
| 5,933,313 | * 8/1999 | Furukawa | ............................ 361/154 |

FOREIGN PATENT DOCUMENTS

| | | |
|---|---|---|
| 367006 | 5/1990 | (EP) . |
| 50-87564 | 7/1975 | (JP) . |
| 63-16310 | 2/1988 | (JP) . |
| 64-85569 | 3/1989 | (JP) . |

OTHER PUBLICATIONS

N. Kumagai, "Gate Operation Circuit configuration with a Power Supply for MOS–Gate Devices", Proceedings of 1992 International Symposium on Power Semiconductor Devices & IC's tokyo, May 19–21, 1992, pp. 194–197.

* cited by examiner

Primary Examiner—Fritz Fleming
(74) Attorney, Agent, or Firm—Greer, Burns & Crain, Ltd.

(57) ABSTRACT

In a circuit that controls the mean current flowing to a load 40 by turning ON or OFF in predetermined ratio the power source voltage VB applied to load 40 using for this purpose a switch means Sw1, a capacitor C1 is charged with the potential difference generated between the load 40 and power source whilst switch means Sw1 is OFF, and a voltage for control purposes which exceeds power source voltage VB is applied to drive circuit 20 using this stored voltage. A high side switch can thereby be implemented using N type semiconductor elements in a simple circuit.

2 Claims, 8 Drawing Sheets

US 6,236,122 B1

LOAD DRIVE DEVICE

This is a divisional of application Ser. No. 08/732,292, filed Oct. 30, 1996, now U.S. Pat. No. 5,952,740 issued on Sep. 14, 1999.

TECHNICAL FIELD

The present invention relates to a load drive device wherein the load is driven with intermittent voltage applied to the load or with the current controlled; in particular, it relates to a load drive device of simple construction and high reliability.

BACKGROUND ART

Conventionally, as a load drive device wherein an inductive load such as for example the coils of a solenoid plunger or stepping motor were driven, a device has been employed whereby the mean voltage or mean current applied to the load is controlled by opening and closing a circuit opening/closure means inserted between this load and the power source and consisting of a semiconductor switch or the like. This device is known as a chopper control or PWM (pulse width modulation) control, and a typical conventional circuit layout is shown in FIG. 11 and FIG. 12.

The circuit shown in FIG. 11 is of a circuit construction called a high side switch for switching current on the power source side of the load; the circuit shown in FIG. 12 has a circuit construction called a low side switch that switches current on the earthed side of the load.

FIG. 11 is constituted by providing two transistors TR1, TR2 constituting switch means and two resistors R0, R1; a PWM signal of predetermined duty ratio is applied to the base of transistor TR1, a power source is connected to the emitter of transistor TR2; resistor R0 is connected between the emitter and base of transistor TR2; resistor R1 is connected between the collector of transistor TR1 and the base of transistor TR2; and the emitter of transistor TR1 is earthed. Also, a flywheel diode FD is connected in parallel with the inductive load L that is the subject of drive by this circuit; the cathode of flywheel diode FD is connected to the collector of transistor TR2; and the anode of flywheel diode FD is earthed.

With such a construction, when the PWM signal becomes high level, turning transistor TR1 ON, in response to this, transistor TR2 is turned ON, and the power source is applied to load L through transistor TR2, so that load current flows to earth from the power source through transistor TR2 and load L. When this happens, due to the characteristic of the load L, this load current increases with time, finally becoming constant at a saturation point given by the power source voltage and the amount of resistance, not shown, in inductive load L.

However, when chopper control is exercised, with the object of controlling the mean current flowing in the load, the mean current value required in load L is lower than the current value at the saturation point, so, before the load current flowing in load L reaches this saturation point, the PWM signal goes from high level to low level, causing transistor TR1 to go from ON to OFF and transistor TR2 also to go from ON to OFF, cutting off the power source from load L.

In this connection, the ON/OFF timing of transistor TR2, i.e. the timing of high level/low level of the PWM signal is determined by for example ON/OFF ratio control (duty control) of transistor TR2 based solely on the time or by detecting the load current flowing in load L by means of a current detector, not shown, in accordance with a predetermined standard such as constant-current control based on its instantaneous value or mean value.

In either case, when transistor TR2 turns OFF and the power source is cut off from load L, the load current flowing in load L flows back through flywheel diode FD due to the inductive component of load L, and is gradually decreased by the electrical resistance of the circuit and the forward voltage of the flywheel diode FD.

In this condition, when the PWM signal again goes from low level to high level, causing transistor TR1 to turn ON and transistor TR2 to turn ON, the power source is once more connected to load L and the load current flowing in load L progressively increases as described earlier.

Thus, with this high side switch, the ON/OFF timing of transistor TR2 is altered by means of the ON/OFF timing of the PWM signal applied to the base of transistor TR1, and the load current flowing in load L can thereby be controlled.

The advantages of this high side switch include:

(1) Load L is on the earth side of the switch (transistor TR2), so that voltage is not constantly applied to load L, so, even if a short circuit occurs when load L is not being driven, it is still safe; this arrangement is also on the safe side so far as electrical corrosion etc. due to moisture is concerned.

(2) Also, even if there is a short circuit in the wiring of the load whilst the load is being driven, the load L can be cut off by a switch (transistor TR2).

(3) Return wiring from load L can be dispensed with.

On the other hand, a drawback of this high side switch is that, due to the nature of the circuit, P-type elements such as a PNP bipolar transistor, P channel FET, or P channel IGBT etc. must be employed. In general, P type elements are inferior in characteristics to N type elements such as NPN transistors, N channel FETs, or N channel IGBTs in many respects such as their current amplification factor, voltage-withstanding ability, and saturation voltage, and are moreover costly. The efficiency of the switch circuit is therefore poor and it is uneconomic. And if the circuit is constructed using N type elements such as NPN transistors, N channel FETs or the like instead of the P type elements, the circuit construction will normally be an emitter follower or source follower circuit; the efficiency of this is poor in that the base-emitter voltage or gate-source voltage directly affects the collector-emitter voltage or drain-source voltage.

As a method for preventing this, in a high side switch circuit employing an emitter follower or source follower circuit of N type elements such as NPN transistors or N channel FETs, a circuit construction may be adopted wherein a drive power source is provided for base drive or gate drive independently of the main circuit, or, alternatively, in which the drive power source is stepped up in voltage from the main power source voltage by an amount matching the base-emitter voltage or gate-source voltage.

However, a large number of circuit elements are required in order to construct such an insulated power source and/or voltage step-up circuit, so this itself increases the cost of the device, and, furthermore, the failure rate will be increased in proportion to the increase in elements: thus the reliability of the circuit is lowered.

In contrast, FIG. 12 shows a circuit layout, called a low side switch, in which switching of the load current is performed on the earthed side of the load.

In this circuit, a construction is adopted wherein transistor TR1 constituting the switch means is provided on the earthed side of the load and the PWM signal of predetermined duty ratio is applied to the base of this transistor TR1; the circuit can therefore be made of even simpler construction than the high side switch.

When the PWM signal becomes high level and transistor TR1 is turned ON, load current from the power source flows to earth through load L and transistor TR1. When this happens, due to the characteristics of the load L, the load current increases with time, finally becoming constant at a saturation point given by the source voltage and the amount of resistance, not shown, in inductive load L. The chopper control method, whereby a mean current value lower than this saturation point that is required for load L is maintained is essentially the same as described above with reference to the high side switch.

This method is superior in that it can be implemented with a simpler layout than the high side switch, and in that N type semiconductor elements can be employed for the switching elements, the drive voltages of these N type semiconductor elements being always referred to earth, so the emitter or source potential is fixed, etc., but it suffers from the problem that the current cannot be cut off if part of the load gets short-circuited to the earth side.

Apart from this, there is the prior art example of Early Japanese Patent Publication No. H5-57918. This example is constructed as shown in FIG. 13: power source E2 is connected to the gate of N channel FET Sw1 through resistor R1 and diode D1 and a transistor switching element TR1 is provided. In addition, a capacitor C1 is provided at the point of connection of resistor R1 and diode D1. When transistor switching element TR1 is ON, this is charged up, but when it is OFF it is discharged, supplying charge to the gate. The N channel FET can thereby be controlled at the power source side of the load.

However, as can be seen from FIG. 13, this is subject to the problems that a separate power source E2 is required to supply charge to the gate, and, when transistor switching element TR1 is turned ON, apart from the current from this power source E2 that charges capacitor C1, current flows to earth through resistor R1 and transistor switching element TR1, so the efficiency is not necessarily good. If the resistance value is made large in order to reduce the current flowing through this resistor R1, there are problems such as that the charging resistance between gate and source when N channel FET Sw1 is ON becomes large, lowering the speed of switching of the FET.

Apart from current control by digital switching as described above, the method is available of direct control of the current amount in analogue fashion.

FIG. 14 is a block diagram of a conventional analogue control type constant current circuit.

This circuit is constituted of: a current detection circuit 1; a drive control circuit that performs current control by a method such as changing the base voltage of transistor Tr1 in response to the detected current value of current detection circuit 1; and a bipolar transistor Tr1 and power source 3. In comparison with chopper control, this method is not subject to problems such as radiation of unwanted electromagnetic waves from the output wiring or generation of inductive noise. Also, in principle, constant-current control can be performed without special means even if there is a short circuit in the load wiring during driving of the load. However, in practice, the load current flows in a condition with the current control element having applied to it the potential difference between the power source voltage and output terminal voltage, so the loss of this element is considerable, making it necessary to provide some way to emit the amount of heat that is generated by this element under these conditions: this leads to problems in regard to cost and reliability.

As described above, with the conventional inductive load drive devices, in the case of current control using digital switching, if a high side switch (which is safe in regard to short circuiting during operation of the load) is constructed using P type elements, although the circuit construction is simple, the element unit cost is high and the element characteristics poor; whereas, if the switch is constituted using N type elements (which have superior element characteristics), the number of such elements is increased, a separate power source is necessary, and the switching rate is lowered: thus, in either case, there were problems in regard to cost and reliability. And if analogue current control was used, the element loss during operation was high, so that elements were required that could tolerate large loss and, furthermore, some way for the device to emit the heat was required.

A first object of the present invention is therefore to constitute a high side switch of good efficiency using N type elements by means of comparatively few circuit components. A second object is to reduce as far as possible the amount of heat emitted by the elements of an analogue control type constant current circuit by controlling the voltage applied to these elements whilst maintaining constant current control.

DISCLOSURE OF THE INVENTION

The present invention consists in a load drive device comprising a current control element arranged between a load and a power source and a drive circuit that drives the current control element, wherein: the current control element is a switch means that turns ON/OFF the voltage of the power source applied to the load; and the drive circuit comprises: a capacitor that is charged by the potential difference generated between the load and the power source when the switch means is OFF; and a control power source circuit that applies to the drive circuit a voltage for control purposes that exceeds the voltage of the power source when the switch means is ON, using the charge stored on the capacitor.

Also the load driving device may comprise: a first capacitor that is charged by the potential difference generated between the load and the power source when the switch means is OFF; a control power source circuit that supplies to the drive circuit a voltage for control purposes that exceeds the power source voltage when the switch means is ON, using the charge stored by the first capacitor; and one or a plurality of second capacitors charged with a stored voltage higher than the stored voltage of the first capacitor by the potential difference generated between the load and the power source when the switch means is OFF, and that, if the voltage for control purposes produced by the first capacitor drops, charges the first capacitor.

In this way, there is no need to provide a driving power source for driving the current control element independently of the main circuit and a control voltage can be obtained which is higher than the power source voltage by a simple construction. Also the reliability of the circuit is high since the number of circuit elements is small. Also the control voltage applied to the drive circuit can be continued to be maintained over a fixed period.

Furthermore, in a load drive device comprising a current control element provided between the load and the power source and a drive circuit that drives the current control element may be a current variation means that varies the current applied to the load; and the drive circuit may comprise: a potential difference measurement means that finds the potential difference across the current variation means; and power source voltage control means that controls the voltage of the power source such as to make the potential difference small, in response to the result of the detection by the potential measurement means.

In this way, the voltage applied to the element of the constant current circuit can be controlled so as to be as small as possible whilst maintaining constant-current control, and the amount of heat generated by the element can be reduced.

BEST MODE FOR CARRYING OUT THE INVENTION

An inductive load drive device according to the present invention is described in detail below with reference to the appended drawings.

Figure 1:
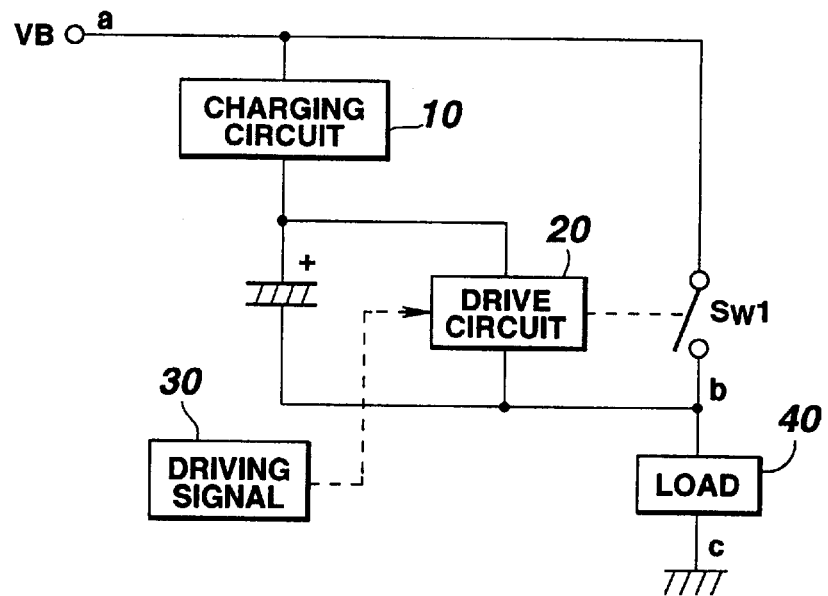
FIG. 1 is a block diagram illustrating the principles of a first invention of the present invention.
Figure 2:
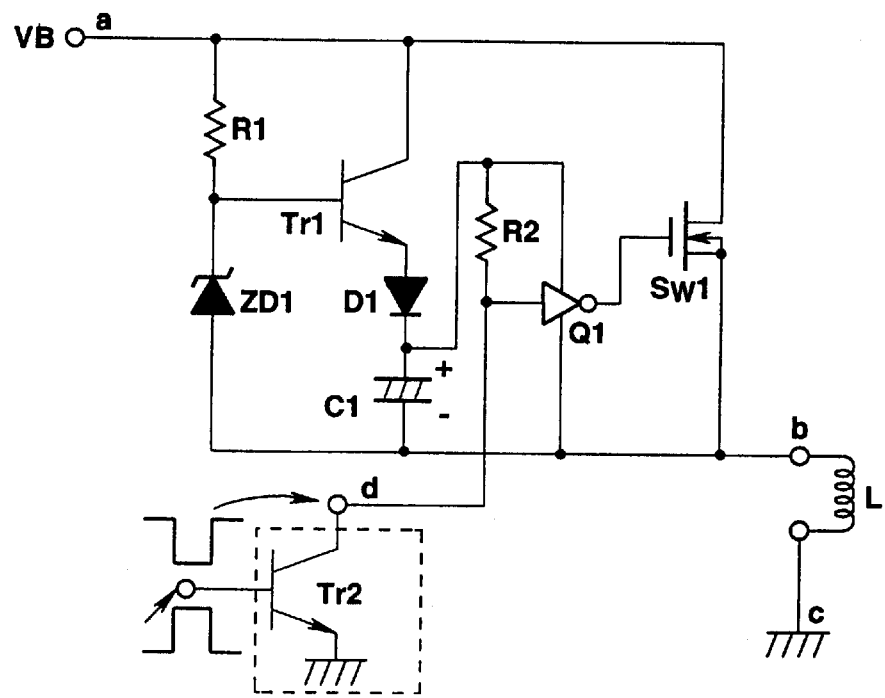
FIG. 2 is a circuit diagram illustrating an embodiment of a load drive device according to the first invention of the present invention.

FIG. 1 shows a block diagram of the principles of the first invention of the present invention; FIG. 2 shows a circuit diagram of an embodiment of the first invention.

An outline of the first invention of the present invention will be described with reference to FIG. 1.

In FIG. 1, Sw1 is a switch element, C1 is a capacitor, 10 is a charging circuit, 20 is a drive circuit, 30 is a drive signal, 40 is a load, and VB is a power source.

Switch element Sw1 performs ON/OFF switching action under the control of a drive circuit 20 in response to a drive signal 30. Let us now consider the case where switching element Sw1 is OFF. In this situation, a potential difference is generated between terminal a and terminal b and capacitor C1 is charged up in accordance with this potential difference by charging circuit 10. This charging circuit 10 includes means for controlling the charging voltage of capacitor C1 and means for preventing charge stored on capacitor C1 from flowing towards power source VB. In this case, the construction is such that the voltage of the charge stored on capacitor C1 is employed in the power source of drive circuit 20.

Next, drive signal 30 inputs an ON signal to drive circuit 20 and switching element Sw1 is thereby turned ON by drive circuit 20. At this point, terminal a and terminal b have practically the same potential. On the other hand, since capacitor C1 prevents the stored charge from flowing towards power source VB, capacitor C1 can continue to supply, as power source of drive circuit 20, a voltage higher than terminal a and terminal b, thanks to the stored charge.

Thanks to the construction shown in FIG. 1, a high side switch employing N type elements can be constituted without employing a second power source or complicated circuit by a small number of circuit components and without impairing device reliability.

FIG. 2 shows an embodiment of a first invention based on this concept. This embodiment is an improved type of high side switch using N type elements.

In FIG. 2, C1 is a capacitor, D1 is a diode, L is a load, Q1 is an inverter circuit R1 and R2 are resistors, Sw1 is a switching element (in this case an FET), Tr1 and Tr2 are NPN transistors, and ZD1 is a Zener diode.

Let us consider the case when load L is not driven. Power source VB is applied between terminal a and terminal c (earth). At this point, since a potential difference is generated between terminal a and terminal b, a voltage equal to the Zener voltage of Zener diode ZD1 is charged on capacitor C1. This charged voltage provides the drive power source voltage of inverter circuit Q1 and inverter circuit Q1 is therefore put into the actuated condition.

Next, let us consider what happens when load L is driven. When this happens, either a drive signal (negative pulse signal) for driving the load is applied to terminal d, or a positive pulse signal is applied to the base of transistor Tr2 enclosed by the dotted line. As a result, the output of inverter circuit Q1 becomes high, and this high voltage is applied between the gate and source of FET Sw1. FET Sw1 is thereby turned ON and the voltage of point b becomes practically equal to the voltage VB of terminal a, so that load L is driven by power source VB.

At this point, the charge that is stored on capacitor C1 is prevented from flowing out to the power source side by diode D1, so the positive side of capacitor C1 maintains unaltered a voltage equal to the Zener voltage of Zener diode ZD1, and supply of drive power source voltage of inverter circuit Q1 is continued. Consequently, drive voltage that is higher than the source potential by the amount of the charged voltage of capacitor C1 continues to be supplied to the gate of FET Sw1. As a result, FET Sw1 can be fully saturated whilst the load is being driven and loss in FET Sw1 can be reduced.

Thanks to the above circuit construction, a high side switch can be produced without greatly increasing the number of circuit elements, even if N type elements such as NPN transistors, N channel FETs, or N channel IGBTs are employed as switching elements, and an efficient induction load drive device can be implemented.

In the circuit of this embodiment, a layout is adopted whereby the power source of inverter circuit Q1 is charged whilst load L is not being driven, so this circuit is suited for circuit applications in which the load is repeatedly turned ON and OFF in intermittent fashion; the time for which FET Sw1 can be continuously maintained in the ON condition is determined by the capacitance of capacitor C1 and the impedance of the drive circuit of inverter circuit Q1; also, the load drive time factor (duty ratio) of FET Sw1 is determined by the charging current of capacitor C1 and the impedance of the drive circuit of inverter circuit Q1.

Figure 3:
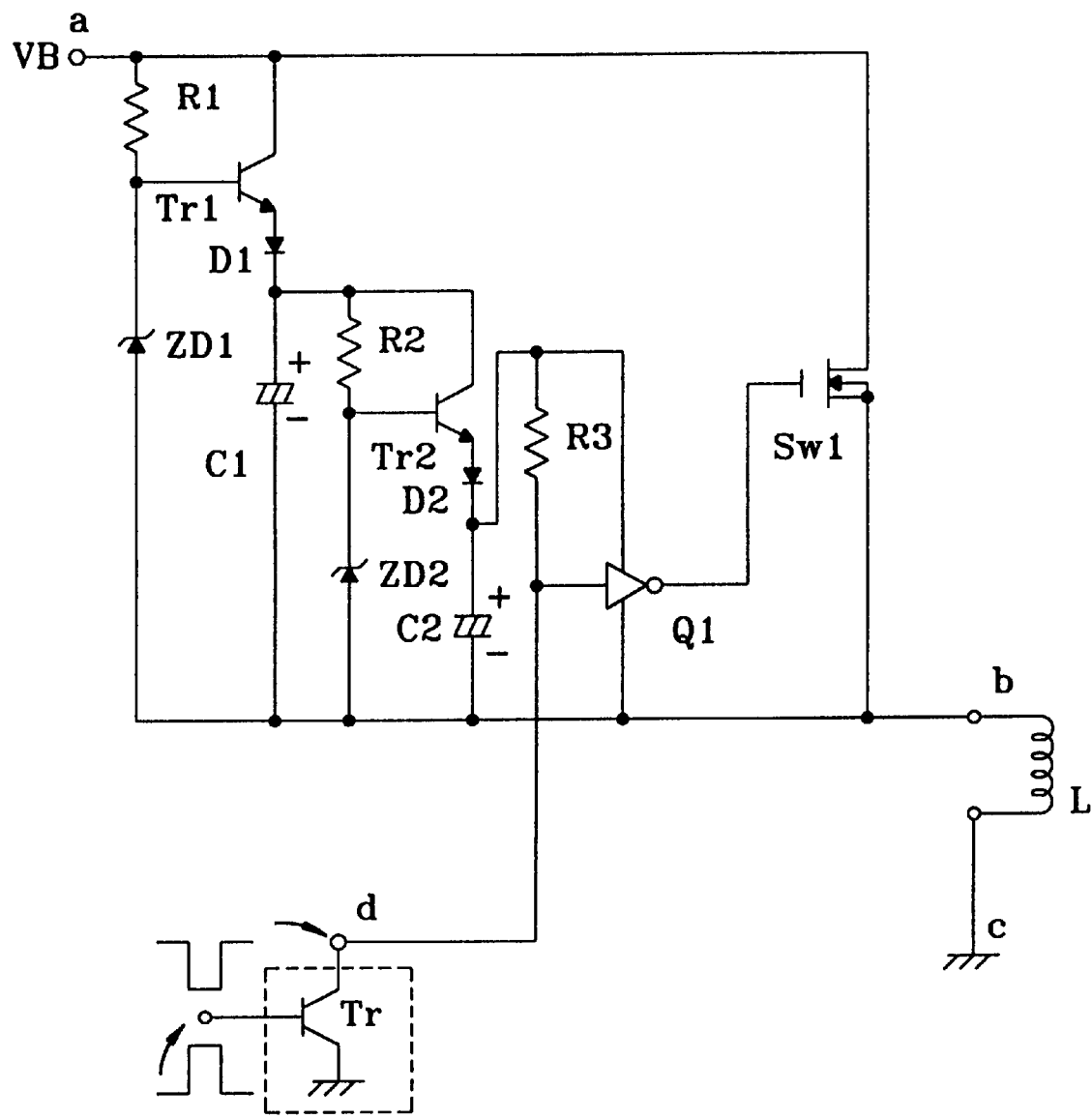
FIG. 3 is a circuit diagram illustrating another embodiment of a load drive device according to the first invention of the present invention.

FIG. 3 shows a circuit diagram of a further embodiment of the first invention. This circuit has a layout in which a further set consisting of capacitor and charging circuit is added to the circuit shown in FIG. 2. In this circuit, the Zener voltage $V_{ZD1}$ of the Zener diode ZD1 is larger than the Zener voltage $V_{ZD2}$ of Zener diode ZD2:

$$V_{ZD1} > V_{ZD2}$$

Let us now consider the situation when load L is not being driven. Power source VB is applied between terminal a and terminal c (earth). In this condition, a potential difference is generated between terminal a and terminal b, so a voltage equal to the Zener voltage $V_{ZD1}$ of Zener diode ZD1 is charged on to capacitor C1. Simultaneously a voltage equal to the Zener voltage $V_{ZD2}$ of Zener diode ZD2 is charged on to capacitor C2. The voltage charged on to this capacitor C2 constitutes the drive power source voltage of inverter circuit Q1, putting inverter circuit Q1 into actuated condition.

Next, let us consider the situation when load L is being driven. In this condition, either a drive signal (negative pulse signal) for driving the load is applied to terminal d and input to inverter circuit Q1, or a positive pulse signal is applied to the base of transistor Tr2 enclosed by the dotted line. The output of inverter circuit Q1 therefore becomes high, and this high voltage is applied between the gate and source of FET Sw1. FET Sw1 is thereby turned ON and the voltage of point b becomes practically equal to the voltage VB of terminal a, so that load L is driven by power source VB.

The charges that are stored on capacitor C1 and capacitor C2 are then respectively prevented from flowing out to the power source side by diode D1 and diode D2, so the positive side of capacitor C1 maintains unaltered a potential equal to the Zener voltage $V_{ZD1}$ of Zener diode ZD1 while the positive side of capacitor C2 maintains unaltered a potential equal to the Zener voltage $V_{ZD2}$ of Zener diode ZD2.

Supply of drive power source voltage of inverter circuit Q1 is continued by the potential of capacitor C2. In more detail, the gate of FET Sw1 continues to be supplied with a drive voltage that is higher than the source potential by the amount of the charge stored on capacitor C1. As a result, FET Sw1 can be fully saturated whilst the load is being driven and losses in FET Sw1 can thus be reduced.

If the potential of capacitor C2 should happen to fall below the Zener voltage $V_{ZD2}$ due to power consumption by inverter circuit Q1 for example, the charge of capacitor C1 charges capacitor C2 through transistor Tr2 and diode D2: thus, action takes place such that the positive side of capacitor C2 maintains a potential equal to the Zener voltage $V_{ZD2}$ of Zener diode ZD2. If the loss of transistors Tr1, Tr2 and diodes D1, D2 is neglected, the potential of capacitor C2 is maintained at a value equal to the Zener voltage $V_{ZD2}$ up to the time point where the potential of capacitor C1 becomes equal to the potential of capacitor C2. Whilst the potential of capacitor C2 is being maintained, the power source voltage of inverter circuit Q1 is fixed, so the increase in loss in Sw1 due to fall of the gate voltage of the FET such as is generally known to take place cannot occur.

In FIG. 3 a two-stage construction is adopted with two sets of charging circuit and capacitor being provided;t although this further addition of a charging circuit and capacitor set results in a multi-stage construction, it does of course enable the power source voltage of inverter circuit Q1 to be kept fixed over a longer time.

Although in FIG. 2 and FIG. 3 an inverter circuit was employed as drive circuit, there would be no problem if the polarity of the drive signal pulse were inverted and a buffer circuit were used. Alternatively, an operational amplifier circuit or comparator circuit etc. could be employed as drive circuit.

Figure 4:
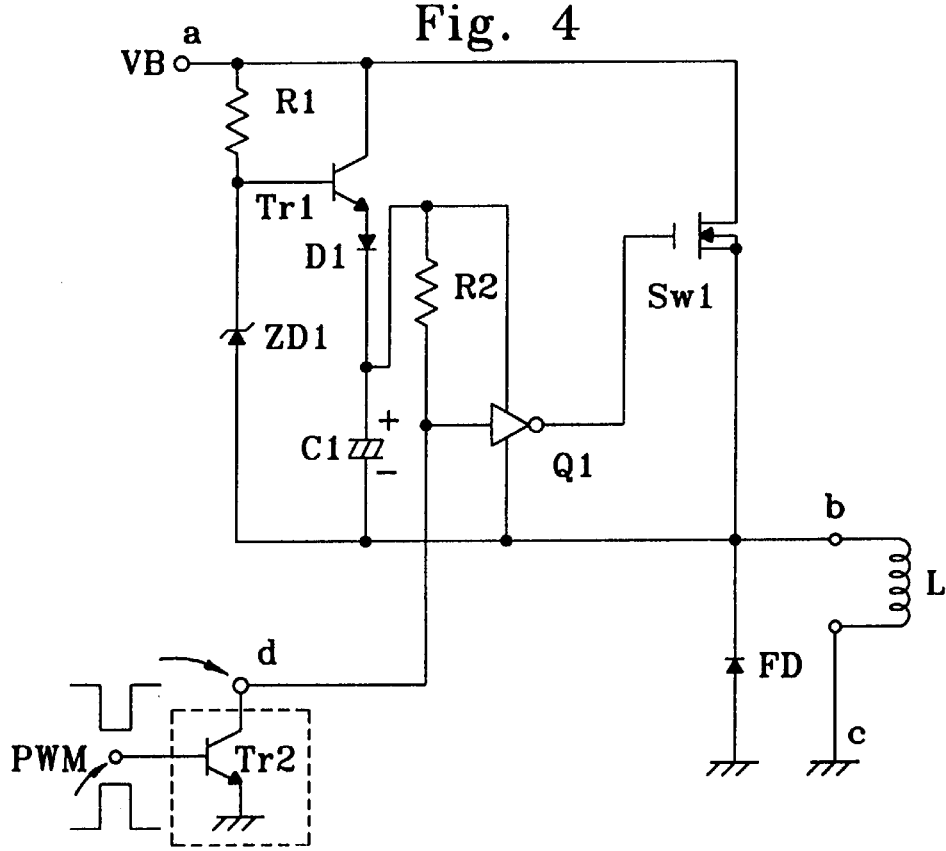
FIG. 4 is a circuit diagram of a PWM control circuit employing the embodiment of the present invention shown in FIG. 2.

FIG. 4 is a circuit example of a PWM control circuit employing the first embodiment of the first invention shown in FIG. 2. The mean value of the current flowing through load L can be controlled by turning FET Sw1 ON and OFF with a timing under the control of a current detector or the like, not shown, by applying a PWM signal to the base of transistor Tr2 or to terminal d. FD is a flywheel diode.

Figure 5:
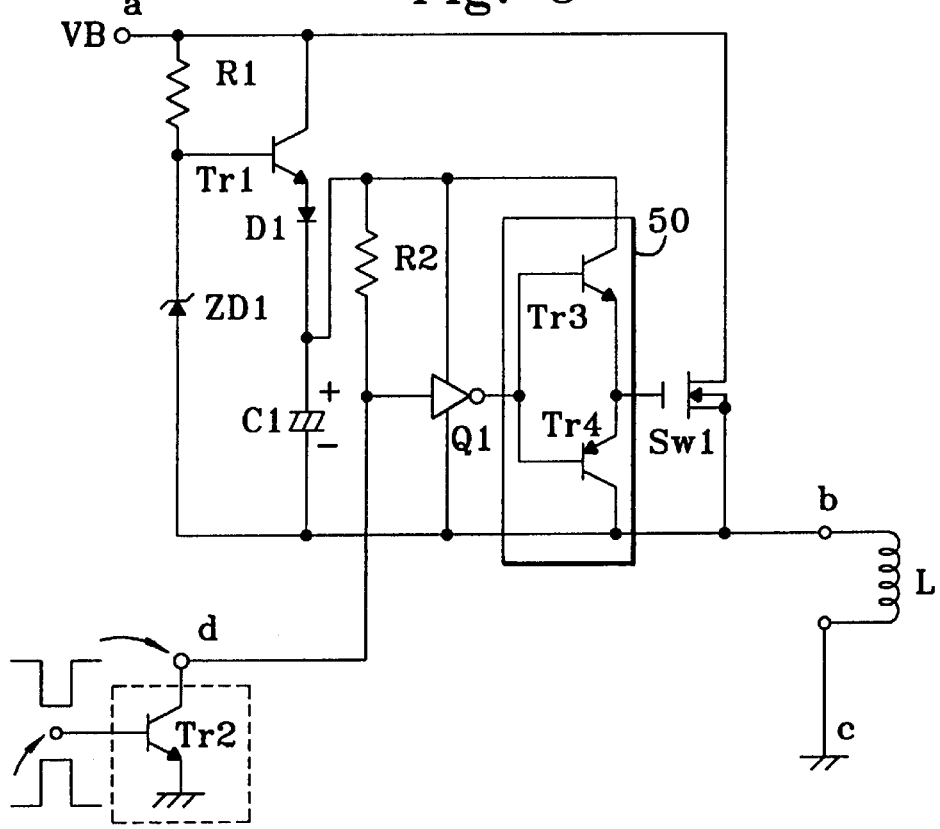
FIG. 5 is a circuit diagram illustrating another embodiment of a load drive device according to the first invention of the present invention.

FIG. 5 is an embodiment in which, in the circuit of the embodiment of the present invention shown in FIG. 2, there is provided a so-called complementary circuit 50 between inverter circuit Q1 and the gate of FET Sw1 in order to raise the switching speed by lowering the impedance between the gate and source of FET Sw1. With the present invention, since a construction is adopted in which the charging circuit including the capacitor and the drive circuit are respectively independent, such a construction can easily be implemented, and a high speed switching action can be achieved.

As described above, the first invention of the present invention possesses the excellent characteristics that:

1. Since a construction is adopted wherein a capacitor is charged by a potential difference generated between the load and the power source whilst the switching means is OFF, and this stored charge is used as the power source of the drive circuit, a separate source to drive the switching means is not necessary.

2. Since charging and discharge of the capacitor is performed automatically in response to ON/OFF of the switching means, an element to change over between charging and discharging of the capacitor is not necessary.

3. Since the capacitor and drive circuit are independent, it is easy to insert a circuit such as a complementary circuit to implement low-impedance drive of the switching means.

4. Since the charging voltage of the capacitor can be accurately determined by the charging circuit, it is not necessary to, for example, set this suitably on the high side; furthermore, since the charging action is stopped if the charged voltage reaches a specified voltage, there is no possibility of over-charging, so, to that extent, there is an advantage in terms of efficiency.

Furthermore, the circuit is simple, loss is small, operation is stable and the circuit is economic.

Figure 6:
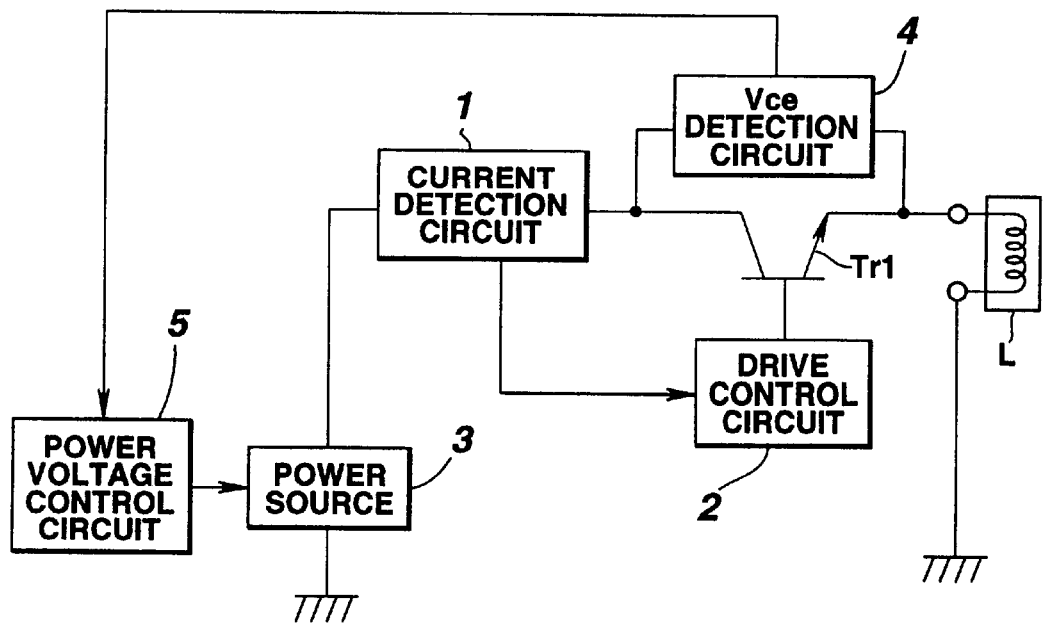
FIG. 6 is a block diagram of an embodiment of a load drive device according to a second invention of the present invention.

Next, a block diagram of a second embodiment of the invention is illustrated in FIG. 6.

As shown in FIG. 6, the circuit comprises: a current detection circuit 1, a drive control circuit 2, a drive bipolar transistor Tr1, a Vce detection circuit 4 that detects the collector-emitter voltage of transistor Tr1 apart from power source 3, and a power source voltage control circuit 5 that controls the output voltage of power source 3 in response to the detection output of Vce detection circuit 4.

The case where this circuit performs a constant-current control action will now be considered. If we assume that only the minimum voltage necessary for the predetermined current to flow to load L is supplied from power source 3 to transistor Tr1, the voltage drop Vce between the collector and emitter of transistor Tr1 will be small. If the voltage of power source 3 should happen to become larger than the minimum voltage required for the predetermined current to flow in load L, the amount by which the voltage is larger appears in the voltage drop Vce between the collector and emitter of transistor Tr1. If voltage Vce gets larger, this is detected by Vce detection circuit 4; power source voltage control circuit 5 is actuated by the output of Vce detection circuit 4 to exercise control such as to lower the power source voltage: thus, the voltage of power source 3 is arranged to be operated with the minimum voltage necessary for the predetermined current to flow in load L, in other words, such that the minimum value of voltage Vce is always maintained. If the circuit is operated in this way, the amount of heat generated in drive transistor Tr1 can be kept to the minimum. The costs involved in removing the heat from the device can thus be cut and circuit reliability improved.

Figure 7:
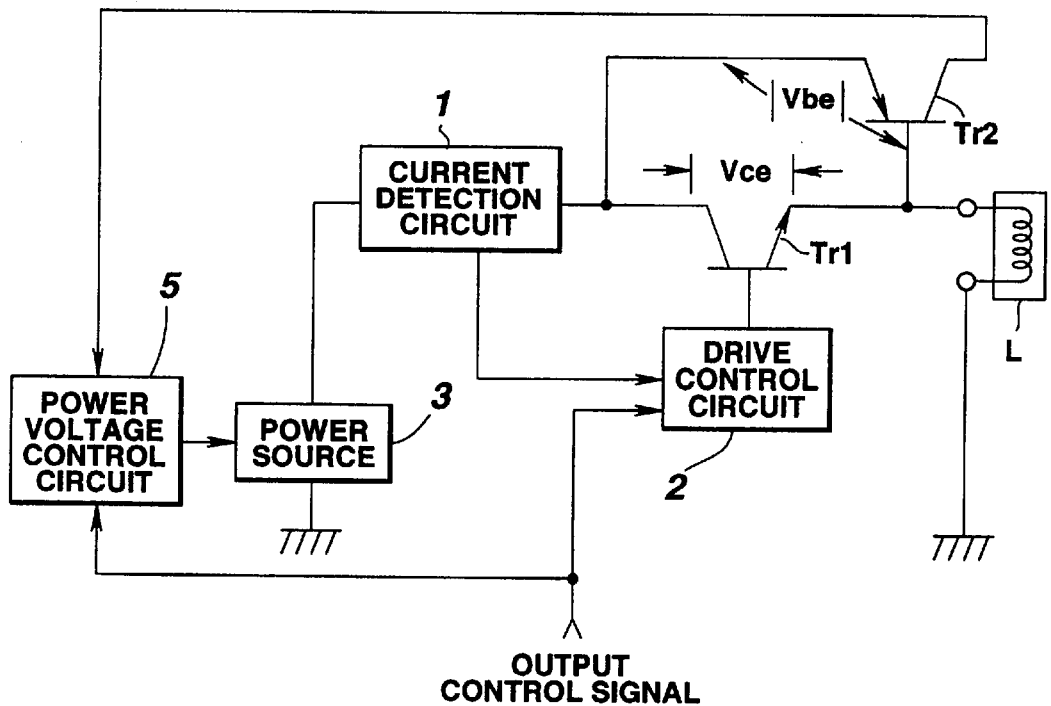
FIG. 7 is a block diagram of another embodiment of the second invention of the present invention.

FIG. 7 shows a circuit in which the Vce detection circuit portion 4 of FIG. 6 can be implemented by a single transistor Tr2 in another embodiment of the second invention of the present invention.

When this circuit is performing constant-current control operation, if the power source voltage is equal to the minimum voltage necessary to supply the predetermined current to load L, the voltage drop Vce between the collector and emitter of transistor Tr1 is small. Therefore, comparing Vce with the voltage Vbe between the base and emitter that would turn transistor Tr2 ON, if:

Vce of transistor Tr1 ≦ Vbe of transistor Tr2

Transistor Tr2 is not turned ON.

However, in this condition, if the impedance of load L changes and gets smaller (this corresponds for example to the case where the load is a solenoid plunger and the temperature gradually drops), the power source voltage gets larger than the minimum voltage required to supply the predetermined current to load L, causing Vce of transistor Tr1 to increase. When this voltage exceeds the voltage Vbe between the base and emitter that turns transistor Tr2 ON, transistor Tr2 is turned ON. On receiving the output signal generated by this transistor Tr2 being turned ON, power source voltage control circuit 5 lowers the voltage power source 3.

By this series of operations the power source voltage is lowered and the voltage drop Vce across the collector and emitter of transistor Tr1 can again be lowered, thereby enabling the amount of heat generated by transistor Tr1 to be kept low.

The above is the case where transistor Tr1 is ON. However, with this circuit, even in the case where transistor Tr1 is OFF due to an output control signal from outside, the collector/emitter voltage Vce will become high. In order to prevent the power source voltage of the circuit thereby being lowered, it is arranged for the output control signal sent to drive control circuit 2 that drives transistor Tr1 to be input also to power source voltage control circuit 5, so that if transistor Tr1 is in cut-off condition, the power source voltage adjustment function of power source voltage control circuit 5 is disabled. In this case, for the power source voltage, either the value immediately prior to transistor Tr1 going OFF in response to the output control signal is output unchanged, or the voltage may be fixed at a predetermined voltage. This selection can be determined by power source voltage control circuit 5 if required.

Although in the embodiment shown in FIG. 6 and FIG. 7 a bipolar transistor was employed for transistor Tr1, exactly the same results would be obtained if this were an ordinary current-control element transistor. For example, an FET, IGBT, or SIT etc. could be employed for this purpose.

Figure 8:
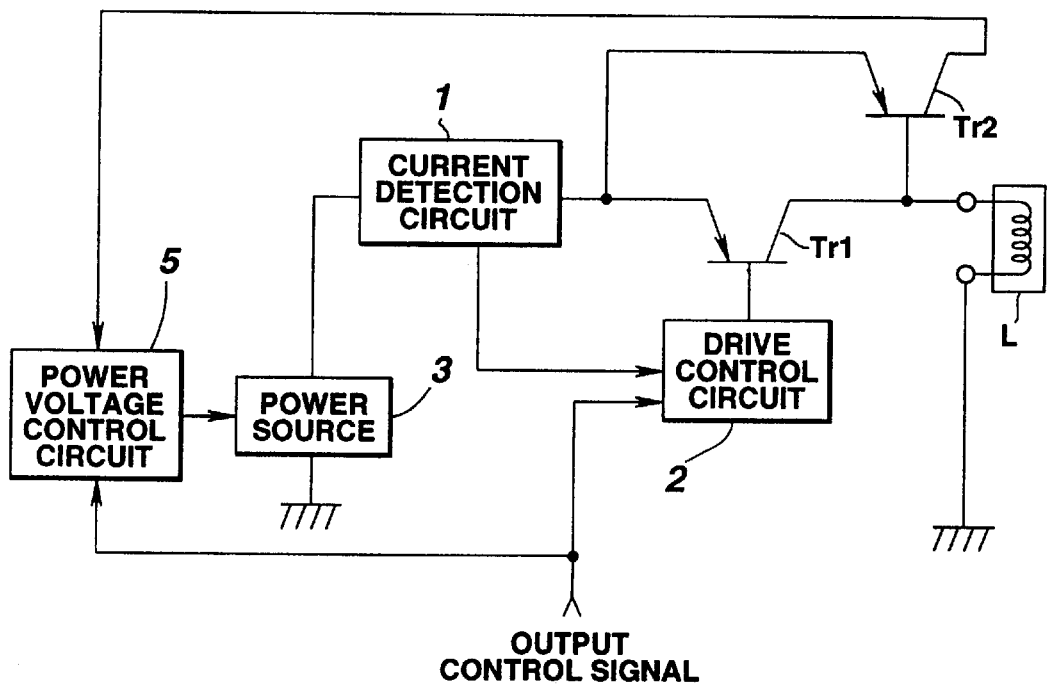
FIG. 8 is a block diagram of yet another embodiment of the second invention of the present invention.

Also, although in the embodiment shown in FIG. 6 and FIG. 7 the circuit was described for the case where transistor Tr1 is an N type element such as an NPN transistor, as shown in FIG. 8, the same effects could of course be obtained with a P type element such as a PNP transistor.

Figure 9:
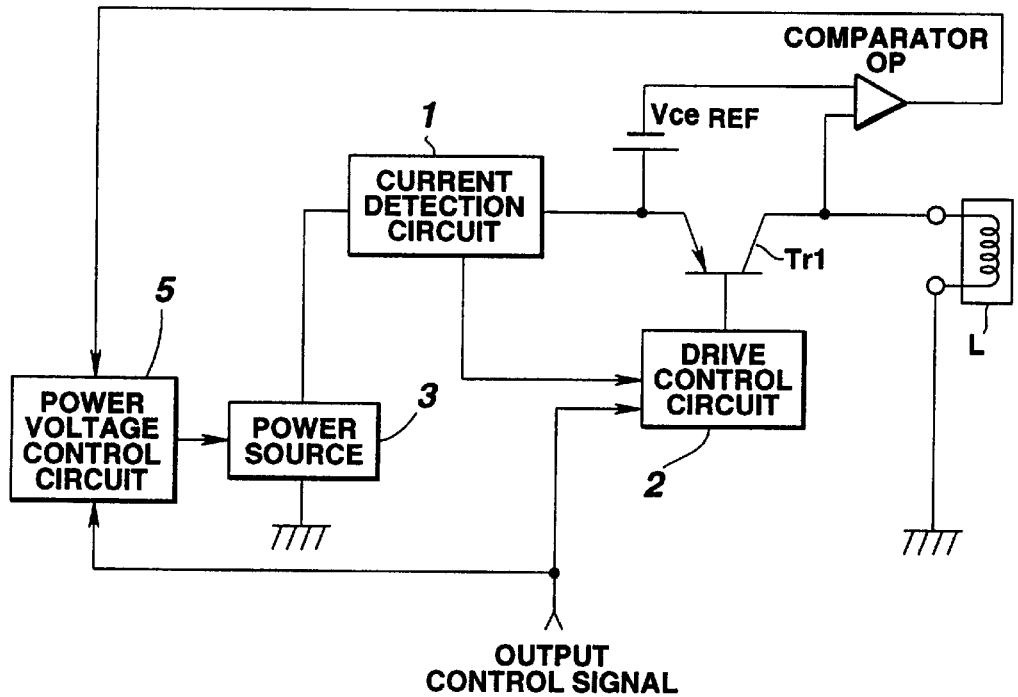
FIG. 9 is a block diagram of yet another embodiment of the second invention of the present invention.
Figure 10:
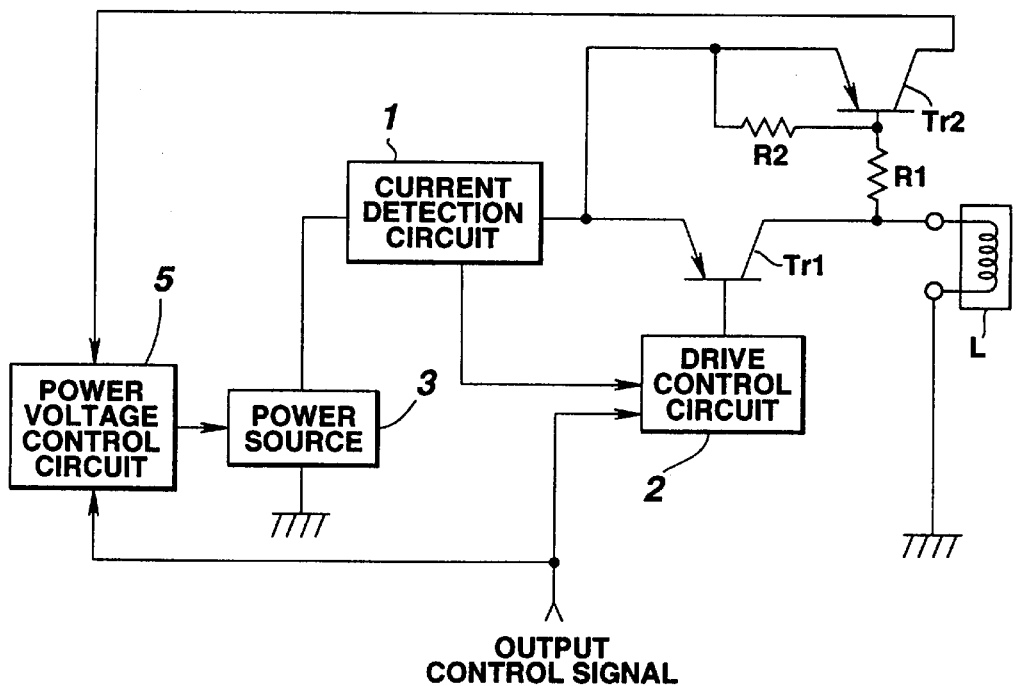
FIG. 10 is a block diagram of yet another embodiment of the second invention of the present invention.
Figure 11:
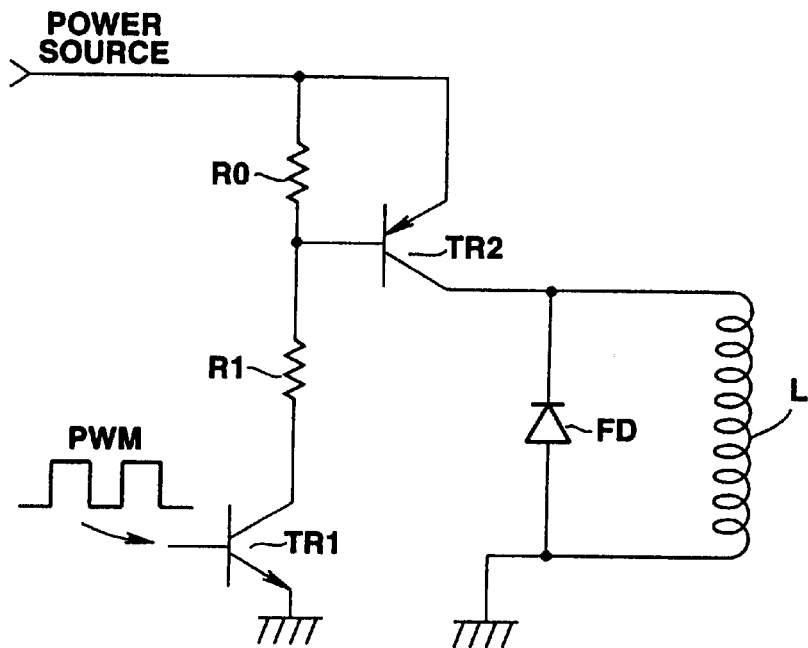
FIG. 11 is a circuit diagram of a prior art example of a load drive device.
Figure 12:
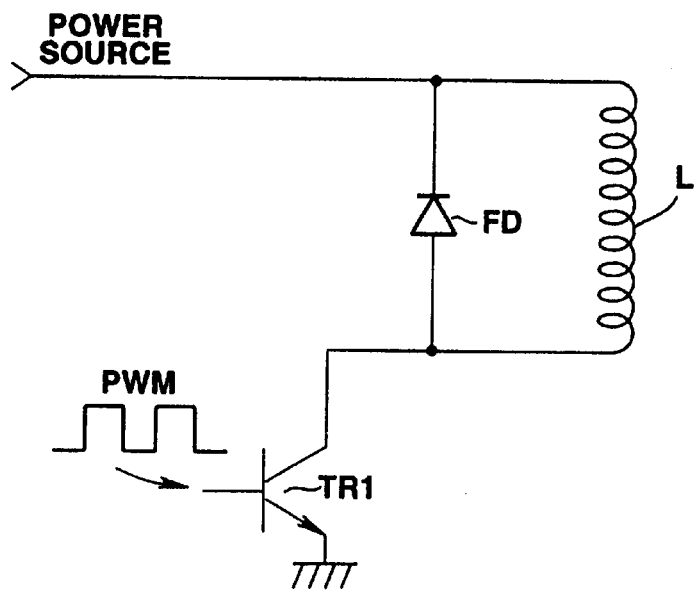
FIG. 12 is a circuit diagram of another prior art example of a load drive device.
Figure 13:
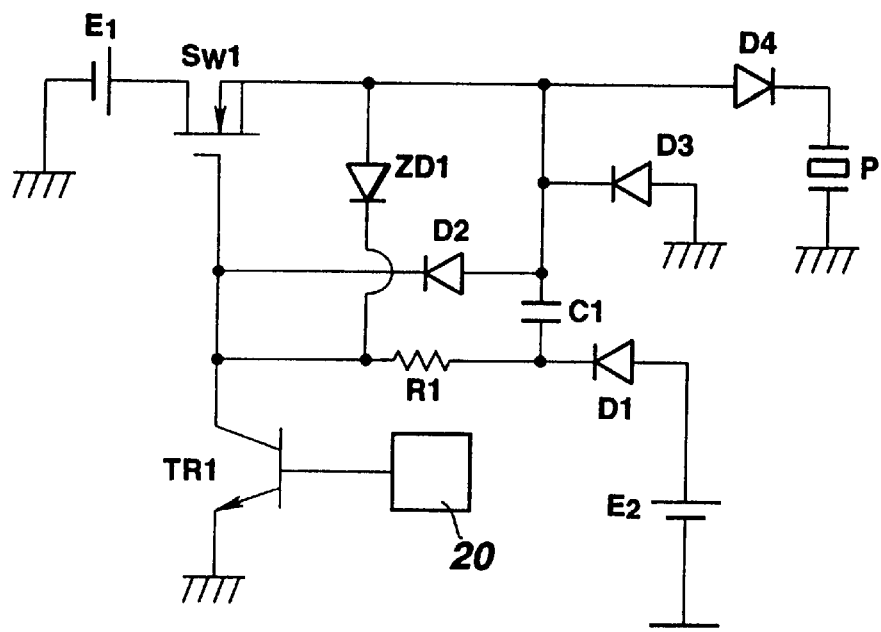
FIG. 13 is a circuit diagram of yet another prior art example of a load drive device.
Figure 14:
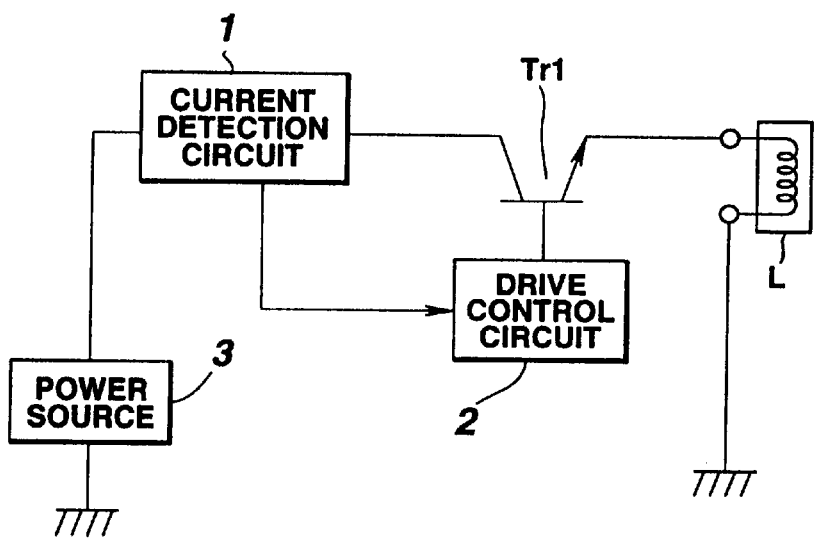
FIG. 14 is a block diagram of yet another prior art example of a load drive device.

Also, although, in the embodiments of FIG. 6 to FIG. 8, a bipolar transistor was employed as transistor Tr2, it would be possible to employ a voltage detection element OP such as an operational amplifier or comparator, as shown in FIG. 9. Also, as shown in FIG. 10, by providing a voltage-dividing resistor between the base and emitter of transistor Tr2, it would be possible to set at will the voltage drop Vce between collector and emitter of transistor Tr1 during operation above the voltage (Vbe) at which this transistor Tr2 is turned ON.

As described above, in the first invention, in a load drive device having a current control element provided between a load and a power source and a drive circuit that drives this current control element the current control element is a switch means that turns ON or OFF the power source voltage applied to the load, and this drive circuit comprises a capacitor that is charged by the potential difference generated between the load and the power source when the switch means is off, and a control power source circuit that supplies to the drive circuit a voltage for control purposes exceeding the voltage of the power source when the switch means is ON.

In this way, there is no need to provide a drive power source for driving the current control element independently of the main circuit, and a control voltage higher than the power source voltage can be obtained by a simple circuit construction. A high side switch can therefore be easily constructed using N type semiconductor elements, which are cheaper and have better performance than P type elements. Furthermore, high reliability can be obtained since the circuit elements are few.

Also, in the load drive device in the second invention, the current control element is a current variation means that varies the current applied to the load, this current variation means comprising a potential difference detection means that detects the potential generated in this current variation means and a power source voltage control means that controls the voltage of the power source such as to make the potential difference smaller, in response to the result of the detection by the potential difference detection means.

In this way, whilst maintaining constant-current control, control can be performed such as to make the voltage applied to the constant-current circuit element as small as possible; the amount of heat generated by the element can therefore be made small, enabling the costs involved in getting rid of the heat of the device to be reduced, and enabling circuit reliability to be increased.

Industrial Applicability

In the first invention, in a load drive device of the chopper control type, there are provided a capacitor that is charged by the potential difference generated between the load and the power source when the switch means is OFF, and a control power source circuit that supplies to the drive circuit of the switch means a voltage for control purposes that exceeds the voltage of the power source, when the switch means is ON, using for this purpose the stored charge of the capacitor: there is thus no need to provide a drive power source for driving the current control element independently of the main circuit, and a control voltage that is higher than the power source voltage can be obtained with a simple circuit construction. A high side switch can therefore be easily constituted using N type semiconductor elements which are inexpensive and of good performance.

In the second invention, with a load drive device comprising a current control element provided between the load and the power source and a drive circuit that drives this current control element, a current variation means is employed as the current control element and this is arranged to control the voltage of the power source so as to make the potential difference generated across this current control element small. The amount of heated generated by the element can therefore be made small and the costs involved in the heat generation of the device can thus be decreased.

In this way, the present invention can be utilized in all types of drive devices for inductive loads, in particular coils for solenoid plungers or stepping motors.

What is claimed is:

1. A load drive device for driving a load by flowing a current into the load, comprising:

a direct current power source for supplying the current to the load; current power source to the load;

a current detecting circuit for detecting the current supplied from the direct current power source to the current control element;

a current control element control circuit for controlling the current control element based on a detection output of the current detecting circuit so that the current flowing into the load becomes a predetermined constant current;

a voltage difference detecting circuit for detecting a voltage difference between a voltage at an input side of the current control element and a voltage at an output side of the current control element; and a power source voltage control circuit for controlling an output voltage of the direct current power source so that when the voltage difference between the voltage at the input side and the voltage at the output side of the current control element detected by the voltage difference detecting circuit exceeds a preset value, the output voltage of the direct current power source becomes small.

2. The load drive device according to claim 1, further comprising:

means for controlling to turn OFF the current control element by a signal from outside; and means for stopping the operation of the power source voltage control circuit to fix the voltage output from the direct current power source to a predetermined value, when the current control element is controlled to be turned OFF.

* * * * *